United States Patent
Stoll et al.

(10) Patent No.: US 9,645,963 B2
(45) Date of Patent: May 9, 2017

(54) SYSTEMS AND METHODS FOR CONCURRENTLY TESTING MASTER AND SLAVE DEVICES IN A SYSTEM ON A CHIP

(71) Applicant: FREESCALE SEMICONDUCTOR, INC., Austin, TX (US)

(72) Inventors: Chris N. Stoll, Dripping Springs, TX (US); Chris P. Nappi, Austin, TX (US); George R. Redford, Tempe, AZ (US); Jayson D. Vogler, Austin, TX (US); Khurram Waheed, Austin, TX (US)

(73) Assignee: NXP USA, Inc., Austin, TX (US)

( * ) Notice: Subject to any disclaimer, the term of this patent is extended or adjusted under 35 U.S.C. 154(b) by 88 days.

(21) Appl. No.: 14/623,293

(22) Filed: Feb. 16, 2015

(65) Prior Publication Data
US 2016/0238654 A1  Aug. 18, 2016

(51) Int. Cl.
*G06F 13/40* (2006.01)
*G01R 31/317* (2006.01)

(52) U.S. Cl.
CPC ... *G06F 13/4068* (2013.01); *G01R 31/31707* (2013.01); *G01R 31/31727* (2013.01)

(58) Field of Classification Search
CPC .......................... G01R 31/317; G06F 13/4068
See application file for complete search history.

(56) References Cited

U.S. PATENT DOCUMENTS

| | | | |
|---|---|---|---|
| 5,187,794 A * | 2/1993 | Hall .................. | G06F 15/177 700/82 |
| 5,392,297 A | 2/1995 | Bell et al. | |
| 6,000,051 A * | 12/1999 | Nadeau-Dostie | G01R 31/31855 327/144 |
| 6,076,177 A | 6/2000 | Fontenot et al. | |
| 6,925,408 B2 | 8/2005 | Premy et al. | |
| 7,225,285 B1 * | 5/2007 | Fairman .................. | G06F 13/24 710/266 |
| 8,122,306 B2 | 2/2012 | Seo | |
| 8,330,477 B1 | 12/2012 | Wu et al. | |
| 2009/0158107 A1* | 6/2009 | Mayer ................... | G06F 11/267 714/734 |
| 2010/0032669 A1 | 2/2010 | An et al. | |
| 2013/0162274 A1 | 6/2013 | Choi | |
| 2014/0122756 A1* | 5/2014 | Laskar ..................... | H04B 1/40 710/106 |
| 2014/0351359 A1* | 11/2014 | Grocutt .................... | G06F 1/12 709/209 |

OTHER PUBLICATIONS

Q. Xu et al., Wrapper design for testing IP cores with multiple clock domains, in Proc. Design, Automation and Test in Europe Conf., pp. 416-421, Feb. 2004.*

* cited by examiner

*Primary Examiner* — April Y Blair
*Assistant Examiner* — Rong Tang

(57) ABSTRACT

An integrated circuit includes a substrate, a master system on the substrate, a slave system on the substrate that is coupled to communicate with the master system, a first clock signal coupled to the master system, and a second clock signal coupled to the slave system. The master system is configured to isolate the slave system from the master system while a first test of the master system is conducted in parallel with a second test of the slave system. The master system uses the first clock signal during the first test and the slave system uses the second clock signal during the second test.

19 Claims, 3 Drawing Sheets

SYSTEMS AND METHODS FOR CONCURRENTLY TESTING MASTER AND SLAVE DEVICES IN A SYSTEM ON A CHIP

BACKGROUND

Field

This disclosure relates generally to testing systems on a chip with master and slave devices, and more specifically, to concurrently testing master and slave devices in a system on a chip.

Related Art

A System on a Chip (SoC) with a complex embedded slave system, such as an integrated Radio, incurs costly test times if the microcontroller unit (MCU) system and the slave system are tested serially. Therefore it is desirable to isolate the MCU and its embedded slave system in a way that allows for concurrent testing of heterogeneous blocks, i.e., MCU and the slave system, such as a radio or other MCU, that have different test requirements.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods are disclosed that allow a slave system to be tested in parallel with a master system in an integrated circuit device. The master system configures the slave system for a test. The slave system is then isolated from the master system by blocking reset signals to the slave system and signals such as interrupts from the slave system to the master system. A separate clock signal can also be used in the slave system independent of the clock signal used by the master system during the testing. While the slave system is being tested, the master system can perform its own test(s), including testing built-in flash memory. While isolated, the master and slave systems can be tested repeatedly as required, per normal test requirements. After both systems have completed their individual testing, the isolation can be removed and any interdependent tests can be performed. The master system is typically a microcontroller and the slave system can be any other suitable device such as a radio system, another microcontroller, or a radio with a built-in microcontroller. The SoC can also include more than one slave device, and all the slave devices can be tested in parallel with one another and with the master system.

Figure 1:
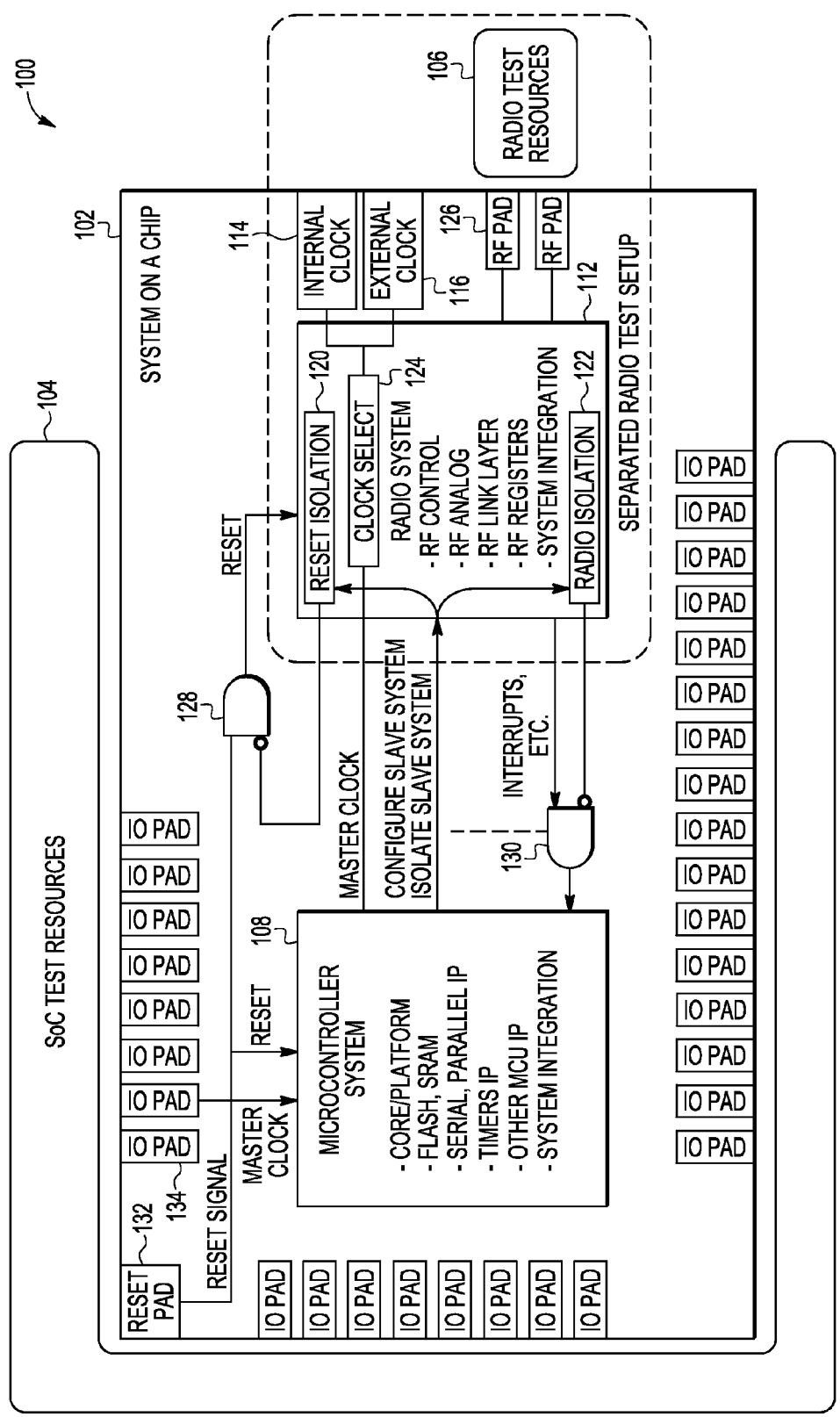
FIG. 1 is a block diagram of an embodiment of a test system for integrated circuitry in accordance with the present invention.

FIG. 1 is a block diagram of an embodiment of a test system 100 including a substrate with integrated circuitry 102 for a System on a Chip (SoC) that can communicate with SoC test resources 104 and radio test resources 106. Implemented on substrate is a master system in the form of microcontroller unit (MCU) 108 and a slave system in the form of radio system 112. Either an internal clock or an external clock will provide a clock signal to clock select logic 124 in radio system 112 via I/O pads or pins 114, 116. A test or master clock signal can also be provided to clock select logic 124. During test periods, clock select logic 124 can use a high quality clock signal from the internal clock or external clock while MCU 108 uses a master clock or other clock signal that does not require the same level of quality as the clock signal for testing radio system 112. During normal operation, clock select logic 124 can provide the master system clock to radio system 112.

Reset isolation indicator 120 and radio isolation indicator 122 can be included in radio system 112 to isolate radio system 112 from MCU 108 during test periods. Reset isolation indicator 120 and radio isolation indicator 122 are set by MCU 108 after radio system 112 is configured for a test. Reset isolation indicator 120 is coupled to an inverting input of logic gate 128 and a SoC reset signal is coupled to a non-inverting input of logic gate 128. The output of logic gate 128 will provide a reset signal to radio system 112 when the reset isolation indicator is set low, but will block the reset signal otherwise. Radio isolation indicator 122 is coupled to an inverting input of logic gate 130 and radio signals such as interrupts from radio system 112 are coupled to a non-inverting input of logic gate 130. The output of logic gate 130 will provide interrupt signals to MCU 108 when the radio isolation indicator is set low, but will block the interrupt signals otherwise. Thus, the reset isolation indicator and radio isolation indicators are set high during test periods in the embodiment shown.

Logic gates 128, 130 are shown as AND gates, but can be implemented using other suitable logic gates in combination with inputs configured to isolate radio system 112 from receiving reset signals and sending interrupt signals to MCU 108.

MCU 108 and logic gate 128 can receive the reset signal via Input/Output (I/O) pad 132 formed at the perimeter or other suitable location on substrate or in the SoC. Other I/O pads 134 can also be included to provide a system or master clock signal to MCU 108, along with conducting other signals being communicated to and from MCU 108. Additionally, a set of radio frequency (RF) I/O pads 126 can be included that are coupled directly to radio system 112.

SoC test resources 104 can be coupled to reset pad 132 and I/O pads 134, and is configured to provide configuration set-up information and test inputs to MCU 108. The tests can be designed to check functionality of processing cores, memory devices, serial and parallel I/O, timers, system integration and other functions of MCU 108. Configuration information for testing one or more slave systems can be provided by SoC test resources and distributed by MCU 108 to the slave systems. For example, when the slave system is a radio system 112, MCU 108 can provide test configuration information to test RF control, RF analog inputs, RF link layer, RF registers, system integration, and other functionality of radio system 112.

Radio test resources 106 can be coupled to RF I/O pads 126 to provide test configuration information to radio system 112 in addition to or instead of information being provided by MCU 108 to radio system 112. When the slave system is another type of device other than radio system 112, corresponding test resources may be included instead of radio test resources 106.

Note that the logic to provide configuration information and to set the reset and radio isolation indicators may be implemented in software, hardware, or any combination thereof.

Figure 2:
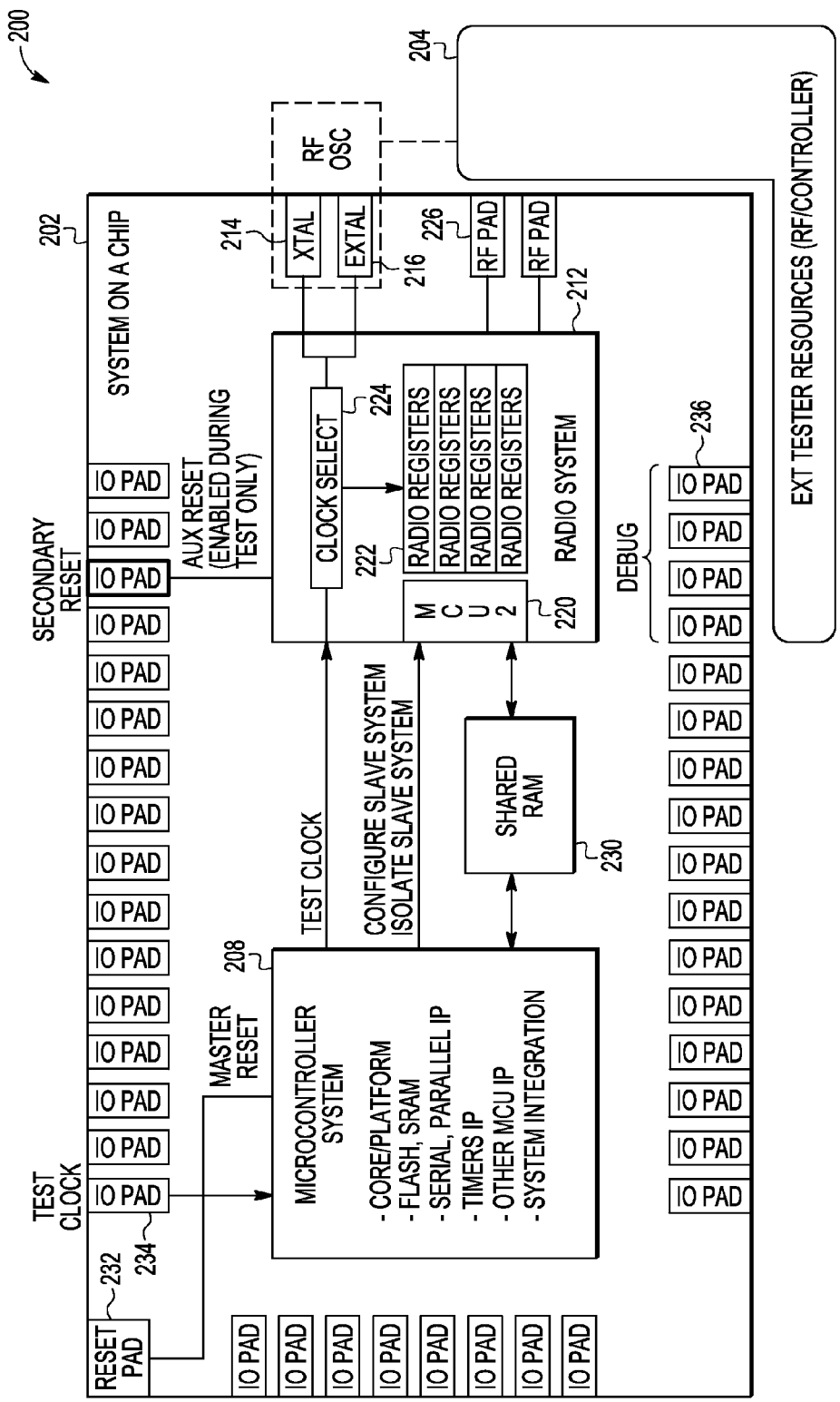
FIG. 2 is a block diagram of another embodiment of integrated circuitry in accordance with the present invention.

FIG. 2 is a block diagram of another embodiment of an SoC test configuration, where the radio system MCU 220 can perform testing using a clean clock signal from an RF crystal oscillator clock source fed via I/O pads or pins 214 and 216, an external single-ended clock in parallel with MCU 208 that uses a separate test clock 234 or a master clock generated on the integrated circuit 202. Signals provided on pins 214, 216 can be used in a differential manner to attach an RF crystal oscillator for the combination radio system 212 and MCU 220. The external crystal works with an on-chip reference oscillator circuit that is used to condition the sinusoidal oscillation waveform from the crystal reference to a buffered and amplitude scaled square wave. This clock is then used as the reference clock in radio system 212. Alternately if there is a crystal oscillator attached to another radio/chip on a board, then the buffered and conditioned output from this external reference can be provided in a single-ended fashion to radio system 212 via pin 216. Note that this single-ended input can also be used on a test platform to inject a tester based high purity clock to the radio, which is also available to the external test resources to allow for synchronized operations between the external tester and radio platform under test.

In the embodiment shown, Integrated circuit or SoC 202 includes a substrate that can communicate with SoC test resources 104 and radio test resources 106 of FIG. 1. SoC 202 includes a master system in the form of microcontroller unit (MCU) 208 and a slave system in the form of radio system 212. Either an internal clock or external clock signal will provide a clock signal to clock select logic 224 in radio system 212 via pins 214, 216. A test or master clock signal can also be provided to clock select logic 224. During test periods, clock select logic 224 can use a high quality clock signal from an external RF (crystal) Oscillator clock or an external single-ended clock while MCU 208 uses a master clock or other clock signal that does not require the same level of quality as the clock signal for testing radio system 212. During normal operation, clock select logic 224 can provide the master system clock to radio system 212.

MCU 208 can receive a system or master reset signal via Input/Output (I/O) pad 232 formed at the perimeter or other suitable location on or in the SoC. Other I/O pads 234 can also be included to provide a test or master clock signal to MCU 208, along with conducting other signals being communicated to and from MCU 208 and radio system 212. For example, radio system 212 can receive an auxiliary reset signal via one or I/O pads 234. The auxiliary reset signal can be generated by a controller external to SoC 202 and is independent of the master reset signal that is sent to MCU 208 and can be used by MCU 220 and/or by other components in radio system 212 during test periods. Additionally, a set of radio frequency (RF) I/O pads 226 can be included that are coupled directly to radio system 212.

SoC 202 can also include a shared memory device 230 that is coupled to MCU 208 and radio system 212. Memory device 230 can be used to communicate test configuration parameters and other information between MCU 208 and radio system 212. Additionally, one or more isolation indicators can be used during test periods to prevent reset signals from MCU 208 being sent to radio system 212, and to further prevent interrupts and other signals being sent from radio system 212 to MCU 208 during test periods.

Test resources 204 can be coupled to one or more debug interface pads 236 on SoC 202 to gain independent access to registers 222 in radio system 212. Test resources 204 can provide test configuration parameters, clock select, and isolation indicators in addition to or instead of the test configuration parameters, clock select, and isolation indicators from MCU 208 via a suitable debug interface such as Single Wire Debug (SWD) or Joint Test Action Group (JTAG) debug interfaces.

Test resources 204 can also be coupled to reset pad 232 and I/O pads 234 to provide configuration set-up information and test inputs to MCU 208. The tests can be designed to check functionality of processing cores, memory devices, serial and parallel I/O, timers, system integration and other functions of MCU 208. Configuration information for testing one or more slave systems can be provided by SoC test resources 204 and distributed by MCU 208 to the slave system(s). For example, when the slave system is radio system 212, MCU 208 can provide test configuration information to test MCU 220, RF control, RF analog inputs, RF link layer, RF registers, system integration, and other functionality of radio system 212.

Test resources 204 can also be coupled to RF I/O pads 226 to provide test configuration information to radio system 212 in addition to or instead of information being provided by MCU 208 to radio system 212 or via debug interfaces 236. When the slave system is another type of device other than radio system 212, other appropriate test resources may be included instead of test resources 204.

Figure 3:
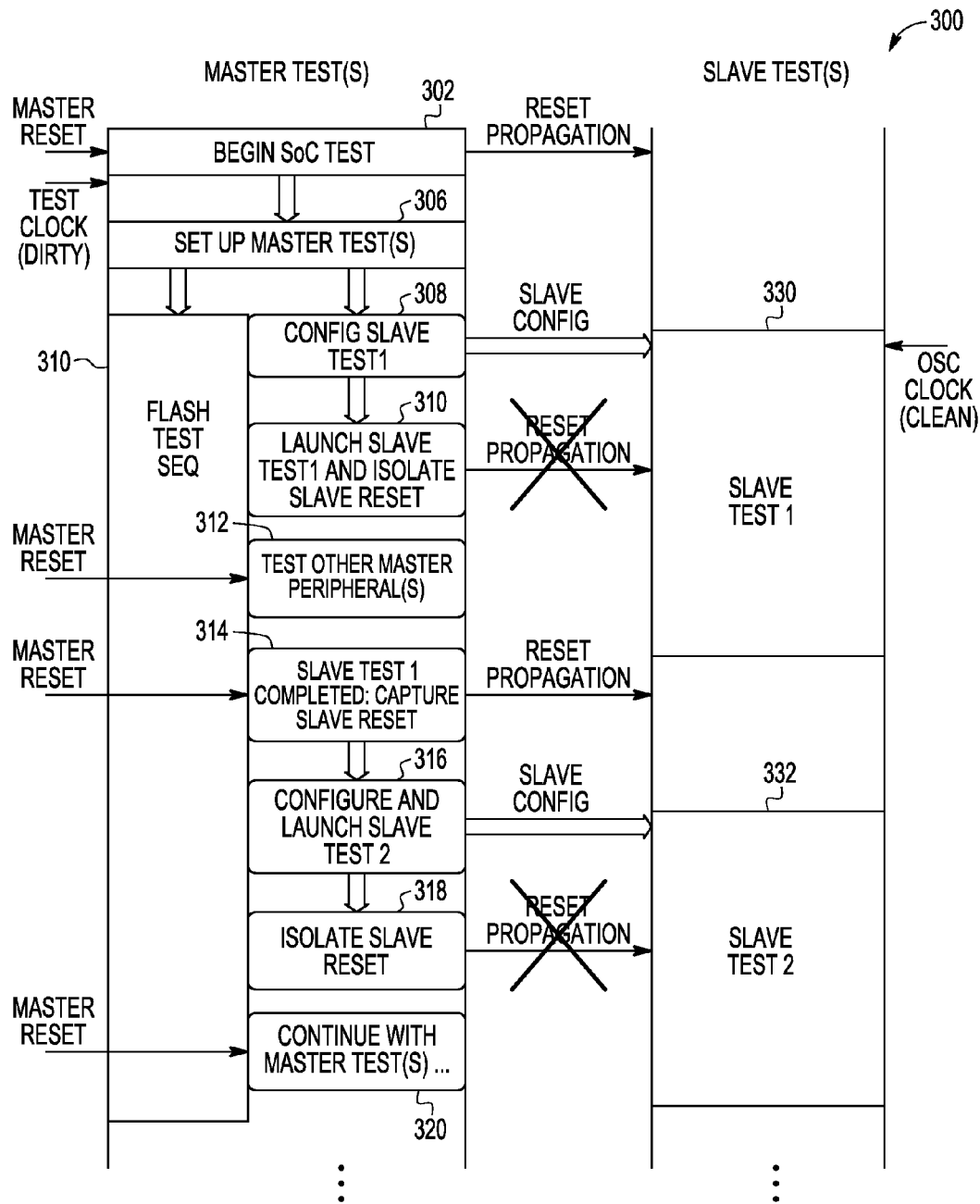
FIG. 3 is a flow diagram showing an example of concurrent testing of master and slave systems on the integrated circuitry of FIGS. 1 and 2.

FIG. 3 is a flow diagram showing an example of a method 300 to concurrently test master and slave systems in the integrated circuitry 100, 200 of FIGS. 1 and 2. Process 302 begins the SoC test by receiving a reset signal in the master system. The master system can propagate the reset signal to the slave system. The reset signal may originate in a controller for a device that uses the SoC. A system clock signal is also received in the master system, typically at regular intervals.

Process 306 can include setting test parameters for the master device including any and all components in the master device such as flash memory, processor core(s), I/O interfaces, system integration, and timers in the master system, among others. Process 308 includes configuring test parameters for the slave system in the master system, and sending the test parameters from the master system to the slave system. The parameters can include an indicator of whether the slave system should use the master clock signal or another clock signal that is more accurate, among other parameters and indicators. Alternatively, or in addition, test configuration information can be provided to the slave system from external test resources via a debug interface.

Process 310 can include isolating the master system from the slave system and launching the test in the slave system, as indicated by process 330. As noted in previously herein in connection with the description of FIG. 1, a reset isolation indicator and a radio (or slave) isolation indicator can be set to prevent system reset signals from being propagated from the master system to the slave system, and to further prevent interrupt signals from being propagated from the slave system to the master system during the test period(s). For example, a reset signal from the master system to the slave system is shown crossed out during the first test of the slave system in FIG. 3 to indicate that the reset signal is prevented from being received in the slave system. In other embodiments, logic can be included in the slave system to ignore reset signals in the slave system based on the reset isolation indicator.

Process 311 can include starting the test of any components that require a significant amount of time to test, such as flash memory, at the start of the test period in the master system once the test for the master system has been configured.

Process 312 can include testing other components in the master system concurrently with the test of flash memory in the master system and with the test being performed in the slave system.

Once the first test in the slave system completes, process 314 includes sending a reset signal from the master system to the slave system. The reset isolation in the slave system can be disabled to allow the reset signal to be sent from the master system to the slave system. Note that the interrupt isolation can remain enabled while the slave system is reset to prevent the slave system from affecting the test(s) being conducted concurrently in the master system.

Process 316 can include the master system configuring a second test for the slave system if more than one test is to be performed on the slave system. The second test configuration is then provided to the slave system from the master system. Alternatively, or in addition, test configuration information can be provided to the slave system from external test resources via a debug interface. Once the second test configuration information is sent to the slave system, process 318 re-establishes reset isolation between the master and slave systems, and the second test of the slave system can be initiated and performed concurrently with tests running in the master system, as indicated by process 332. A reset signal from the master system to the slave system is shown crossed out during the second test of the slave system in FIG. 3 to indicate that the reset signal is prevented from being received in the slave system. In other embodiments, logic can be included in the slave system to ignore reset signals in the slave system based on the reset isolation indicator.

Process 320 includes continuing to test components in the master system while the second test is performed in the slave system. Note that as many tests as desired can be performed in the master and slave systems. Additionally, two or more tests can run concurrently in either or both of the slave system and the master system. Further, the master system can configure tests for more than one slave system, and the additional slave systems can also be isolated from the master system during the test periods.

By now it should be appreciated that in some embodiments there has been provided an integrated circuit (IC) that can include a substrate, a master system (108) on the substrate, a slave system (112) on the substrate and coupled to communicate with the master system, a first clock signal coupled to the master system, and a second clock signal coupled to the slave system. The master system is configured to isolate the slave system from the master system while a first test of the master system is conducted in parallel with a second test of the slave system. The master system uses the first clock signal during the first test and the slave system uses the second clock signal during the second test.

In another aspect, the master system can isolate the slave system by blocking a reset signal to the slave system during the second test.

In another aspect, the slave system can include clock select logic configured to choose between a test clock signal from the master system and the second clock signal.

In another aspect, the IC can further comprise a memory device on the substrate coupled to communicate with the master and slave systems during the first and second test.

In another aspect, the IC can further comprise a first set of input/output pads on the substrate and coupled only to the master system, and a second set of input/output pads on the substrate and coupled only to the slave system.

In another aspect, the IC can further comprise a debug input/output pad on the substrate coupled to a register in the slave system, wherein the debug input/output pad is used to input a signal to isolate the slave system from the master system.

In another aspect, the master system can be a microcontroller and the slave system can be a radio system.

In another aspect, the radio system can include a second microcontroller.

In another aspect, the master and the slave systems can be microcontrollers.

In another aspect, the IC can further comprise a master reset signal coupled to the master system, and an auxiliary reset signal coupled to the slave system. The auxiliary reset signal can be enabled only during the second test.

In another aspect, the auxiliary reset signal can be used by a second microcontroller in the slave system.

In another aspect, the IC can further comprise a first logic gate configured to block a reset signal to the slave system when reset blocking is enabled.

In another aspect, the IC can further comprise a second logic gate configured to block interrupt signals from the slave system to the master system when slave output blocking is enabled.

In other embodiments, a method of testing an integrated circuit device can comprise isolating a slave device from a master device by blocking a reset signal to the slave device during a test period, providing a first clock signal to the master device, providing a second clock signal to the slave device during the test period, testing the slave device in parallel with testing the master device during the test period, and using the first clock signal to operate the slave device and the master device during normal operation.

In another aspect, the method can further comprise sharing a memory device between the master device and the slave device during the test period.

In another aspect, the method can further comprise blocking interrupt signals from the slave system to the master system when slave output blocking is enabled.

In another aspect, the master system can be a microcontroller and the slave system can be at least one of a group consisting of a radio system and a second microcontroller.

In another aspect, the method can further comprise configuring the slave system for the test period before blocking the reset signal.

In another aspect, the method can further comprise utilizing an auxiliary reset signal for the slave device during the test period.

In another aspect, isolating the slave system from the master system can include using a debug input/output pad to provide a signal to indicate whether to block the reset signal.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

In many implementations, the systems and methods disclosed herein may be incorporated into a wide range of electronic devices including, for example, computer systems or Information Technology (IT) products (e.g., servers, desktops, laptops, switches, routers, etc.), telecommunications hardware, consumer devices or appliances (e.g., mobile phones, tablets, televisions, cameras, sound systems, etc.), scientific instrumentation, industrial robotics, medical or laboratory electronics (e.g., imaging, diagnostic, or therapeutic equipment, etc.), transportation vehicles (e.g., automobiles, buses, trains, watercraft, aircraft, etc.), military equipment, etc. More generally, the systems and methods discussed herein may be incorporated into any device or system having one or more electronic parts or components.

Examples of integrated circuitry 102 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), or the like. Additionally or alternatively, integrated circuit(s) 102 may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate (e.g., DDR, DDR2, DDR3, etc.) RAM, an Erasable Programmable ROM (EPROM), an Electrically Erasable Programmable ROM (EEPROM), etc. Additionally or alternatively, integrated circuitry 102 may include one or more mixed-signal or analog circuits, such as, for example, Analog-to-Digital Converter (ADCs), Digital-to-Analog Converter (DACs), Phased Locked Loop (PLLs), oscillators, filters, amplifiers, transformers, etc. Additionally or alternatively, integrated circuit(s) 102 may include one or more Micro-ElectroMechanical Systems (MEMS), Nano-ElectroMechanical Systems (NEMS), or the like.

As such, integrated circuitry 102 may include a number of different portions, areas, or regions. These various portions may include one or more processing cores, cache memories, internal bus(es), timing units, controllers, analog sections, mechanical elements, etc. Thus, in various embodiments, integrated circuit(s) 102 may include a bandgap circuit and a trimming circuit configured to set or control an output voltage—that is, a bandgap voltage—provided by the bandgap circuit. During the production test of integrated circuit(s) 102, the trimming circuit may be adjusted using the various systems and methods for trimming acceleration described herein.

Integrated circuit(s) 102 may be disposed within an electronic component package configured to be mounted onto printed circuit board (PCB) using any suitable packaging technology such as, for example, Ball Grid Array (BGA) packaging or the like. In some applications, the PCB may be mechanically mounted within or fastened onto an electronic device.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An integrated circuit (IC) comprising:
a substrate;
a master system on the substrate;
a slave system on the substrate and coupled to communicate with the master system;
a first clock signal coupled to the master system;
a second clock signal coupled to the slave system, wherein the master system is configured to isolate the slave system from a reset signal from the master system while a first test of the master system is conducted in parallel with a second test of the slave system, and the master system uses the first clock signal during the first test and the slave system uses the second clock signal during the second test.

2. The IC of claim 1, wherein the slave system includes:
clock select logic configured to choose between a test clock signal from the master system and the second clock signal.

3. The IC of claim 1, further comprising:
a memory device on the substrate coupled to communicate with the master and slave systems during the first and second test.

4. The IC of claim 1, further comprising:
a first set of input/output pads on the substrate and coupled only to the master system; and
a second set of input/output pads on the substrate and coupled only to the slave system.

5. The IC of claim 1, further comprising:
a debug input/output pad on the substrate coupled to a register in the slave system, wherein the debug input/output pad is used to input a signal to isolate the slave system from the master system.

6. The IC of claim 1, wherein the master system is a microcontroller and the slave system is a radio system.

7. The IC of claim 6, wherein the radio system includes a second microcontroller.

8. The IC of claim 1, wherein the master and the slave systems are microcontrollers.

9. The IC of claim 1, further comprising:
a master reset signal coupled to the master system; and
an auxiliary reset signal coupled to the slave system, wherein the auxiliary reset signal is enabled only during the second test.

10. The IC of claim 9, wherein the auxiliary reset signal is used by a second microcontroller in the slave system.

11. The IC of claim 1, further comprising:
a first logic gate configured to block a reset signal to the slave system when reset blocking is enabled.

12. The IC of claim 11, further comprising:
a second logic gate configured to block interrupt signals from the slave system to the master system when slave output blocking is enabled.

13. A method of testing an integrated circuit device comprising:
isolating a slave device from a master device by blocking a reset signal to the slave device during a test period;
providing a first clock signal to the master device;
providing a second clock signal to the slave device during the test period;
testing the slave device in parallel with testing the master device during the test period; and
using the first clock signal to operate the slave device and the master device during normal operation.

14. The method of claim 13 further comprising:
sharing a memory device between the master device and the slave device during the test period.

15. The method of claim 13, further comprising:
blocking interrupt signals from the slave system to the master system when slave output blocking is enabled.

16. The method of claim 13, wherein:
the master system is a microcontroller and the slave system is at least one of a group consisting of a radio system and a second microcontroller.

17. The method of claim 13, further comprising:
configuring the slave system for the test period before blocking the reset signal.

18. The method of claim 13, further comprising:
utilizing an auxiliary reset signal for the slave device during the test period.

19. The method of claim 13, wherein:
isolating the slave system from the master system includes using a debug input/output pad to provide a signal to indicate whether to block the reset signal.

* * * * *